United States Patent
Honda (10) Patent No.: US 7,352,637 B2
(45) Date of Patent: Apr. 1, 2008

(54) REFERENCE CURRENT GENERATING CIRCUIT OF NONVOLATILE SEMICONDUCTOR MEMORY DEVICE

(75) Inventor: Yasuhiko Honda, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/763,999

(22) Filed: Jun. 15, 2007

(65) Prior Publication Data

US 2007/0237000 A1 Oct. 11, 2007

Related U.S. Application Data

(62) Division of application No. 11/401,278, filed on Apr. 11, 2006.

(30) Foreign Application Priority Data

Apr. 12, 2005 (JP) ............................. 2005-114747

(51) Int. Cl.
*G11C 5/14* (2006.01)

(52) U.S. Cl. ............ 365/189.09; 365/205; 365/189.08; 365/210; 365/185.2; 365/185.21

(58) Field of Classification Search ........... 365/189.09, 365/189.08, 205, 210, 185.21, 185.2
See application file for complete search history.

(56) References Cited

U.S. PATENT DOCUMENTS

| | | | |
|---|---|---|---|
| 6,118,701 A * | 9/2000 | Uekubo | 365/185.2 |
| 6,377,502 B1 | 4/2002 | Honda et al. | |
| 6,469,937 B2 | 10/2002 | Fuchigami et al. | |
| 6,473,338 B2 | 10/2002 | Sugimura | |
| 6,512,693 B2 | 1/2003 | Honda et al. | |
| 6,650,570 B2 * | 11/2003 | Tanzawa et al. | 365/185.22 |
| 6,707,715 B2 | 3/2004 | Michael et al. | |
| 6,801,457 B2 * | 10/2004 | Tanzawa et al. | 365/185.22 |
| 6,807,097 B2 | 10/2004 | Takano et al. | |
| 6,829,194 B2 | 12/2004 | Honda et al. | |
| 6,865,125 B2 * | 3/2005 | Tanzawa et al. | 365/200 |
| 6,920,057 B2 | 7/2005 | Honda et al. | |
| 7,116,598 B2 * | 10/2006 | Shimizu et al. | 365/210 |
| 2004/0057326 A1 | 3/2004 | Ikehashi et al. | |
| 2005/0207247 A1 | 9/2005 | Honda et al. | |

FOREIGN PATENT DOCUMENTS

| JP | 02004039075 A * | 2/2004 |
|---|---|---|
| JP | 2004-103211 | 4/2004 |

OTHER PUBLICATIONS

B. Pathak, et al., "A 1.8V 64Mb 100MHz Flexible Read While Write Flash Memory", 2001 IEEE International Solid-State Circuits Conference, Session 2,, Non-Volatile Memories, 2.3, Feb. 5, 2001, 3 Pages.

* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A reference current generating circuit has a plurality of current mirror circuits each having a mirror ratio different from another one, and generates a plurality of reference currents based on a current that flows to the reference memory cells. A plurality of sense amplifiers detects a current that flows to a selected memory cell based on the reference currents generated by the reference current generating circuit.

8 Claims, 12 Drawing Sheets

REFERENCE CURRENT GENERATING CIRCUIT OF NONVOLATILE SEMICONDUCTOR MEMORY DEVICE

CROSS-REFERENCE TO RELATED APPLICATIONS

This application is a divisional of and claims the benefit of priority under 35 USC §120 from U.S. Ser. No. 11/401,278, filed Apr. 11, 2006 and is based upon and claims the benefit of priority under 35 USC §119 from the Japanese Patent Application No. 2005-114747, filed Apr. 12, 2005, the entire contents which is incorporated herein by reference.

BACKGROUND OF THE INVENTION

1. Field of the Invention

The present invention relates to an NOR type nonvolatile semiconductor memory device for storing multi-valued data, for example, and particularly to a reference current generating circuit applied to a sense amplifier of the semiconductor memory device.

2. Description of the Related Art

There has been a variety of nonvolatile semiconductor storage devices (hereinafter, referred to as a memory) which are composed of EEPROM cells and electrically erased in batch, for example. NOR type flash memory readout and verify operations, for example, are executed by comparing currents that flow to a selected memory cell and a reference memory cell by means of a sense amplifier (for example, Jpn. Pat. Appln. KOKAI Publication No. 2004-103211, B. Pathak et al., A 1.8 V 64 Mb 100 MHz Flexible Reed While Write Flash Memory, 2001, IEEE International Solid-State Circuits Conference). This system is called a current comparison type sense system.

As the current comparison sense system, there are known two types of an Iref direct coupling system of directly supplying a reference current Iref to an input end of a sense amplifier and an Iref mirror system of supplying a reference Iref to an input end of a sense amplifier via a current mirror circuit.

The Iref direct coupling system uses a plurality of reference memory cells. Threshold voltages of reference memory cells each are not uniform, and have a dispersion. Thus, in order to reduce the dispersion of the threshold voltages of the reference memory cells, a long adjustment time is required. In contrast, the Iref mirror system has a merit that an adjustment time is reduced because only one reference memory cell is used.

On the other hand, with respect to a current margin for reading out data from a memory cell, the Iref mirror system is more excellent as compared with the Iref direct coupling system in both of a case of reading out data "0" from a memory for storing a two-valued state and a case of reading out data "1". That is, voltage/current characteristics of memory cells in the Iref direct coupling system are substantially parallel to a gradient of voltage/current characteristics of a reference memory cell. Thus, in an effect on the sense current margin relevant to each of the memory cells which does not supply a current, the memory cells having stored data "0" and each of the memory cells which supplies a current, the memory cells having stored data "1" due to a threshold value fluctuation of a memory cell due to a temperature, the sense current margin on the memory cell side having stored data "0" is reduced. In contrast, in the case of the Iref mirror system, the voltage/current characteristics of a reference memory cell are specified in accordance with a mirror ratio of a current mirror circuit, and a different gradient with respect to a gradient of the voltage/current characteristics of the memory cell can be set. That is, the effect on the sense current margin relevant to the above-described fluctuation can be distributed to each of the memory cells having stored data "0" and data "1".

In the meantime, recently, there has been developed a multi-value memory for storing a multi-valued state of 2 bits or more in one memory cell. In the case of the multi-value memory, more reference currents are required as compared with a two-value memory, and moreover, it is necessary to generate a plurality of reference currents with high accuracy. For example, when four-valued data are to be stored, it is necessary to generate three reference currents. In the case where a number of reference currents are thus generated, it becomes difficult to allocate a current margin relevant to the dispersion in a conventional Iref mirror system. Thus, there is proposed use of the Iref direct coupling system. However, in the case of the Iref direct coupling system, there is a need for reference memory cells whose number is equal to that of the reference currents. Thus, there is a problem that a long time is required for adjusting the reference memory cells.

Therefore, there is demand for a nonvolatile semiconductor memory device having a reference current generating circuit which is capable of reducing a time for adjusting a threshold voltage of a reference memory cell and which is capable of allocating a sufficient current margin.

BRIEF SUMMARY OF THE INVENTION

According to a first aspect of the present invention, there is provided a nonvolatile semiconductor memory device, comprising: at least one reference memory cell; and a reference current generating circuit having a plurality of current mirror circuits, the reference current generating circuit generating a plurality of reference currents by means of a plurality of the current mirror circuits based on a current that flows to the reference memory cell, and supplying the generated reference currents to a sense amplifier.

According to a second aspect of the present invention, there is provided a nonvolatile semiconductor memory device, comprising: a plurality of reference memory cells in which different threshold voltages from each other are set; a selector circuit which selects one reference memory cell from the plurality of reference memory cells; and a sense amplifier which compares a reference current which flows the one reference memory cell selected by the selector circuit with a current which flows to a selected memory cell.

According to a third aspect of the present invention, there is provided a nonvolatile semiconductor memory device, comprising: a sense amplifier in which a current flowing through a selected memory cell is supplied to one input end, and a current flowing through a reference memory cell is supplied to the other input end; a first transistor connected between the other input end of the sense amplifier and the reference memory cell; a second transistor, one end of which is connected to the other input end of the sense amplifier; a constant current source connected to the other end of the second transistor; and a third transistor, one end of which is connected to one input end of the sense amplifier, and the other end of which is connected between the first transistor and the reference memory cell; wherein the first transistor is turned OFF, and the second and third transistors are turned ON at the time of adjustment of the reference memory cell.

DETAILED DESCRIPTION OF THE INVENTION

There will now be described embodiments of this invention with reference to the accompanying drawings.

Figure 2:
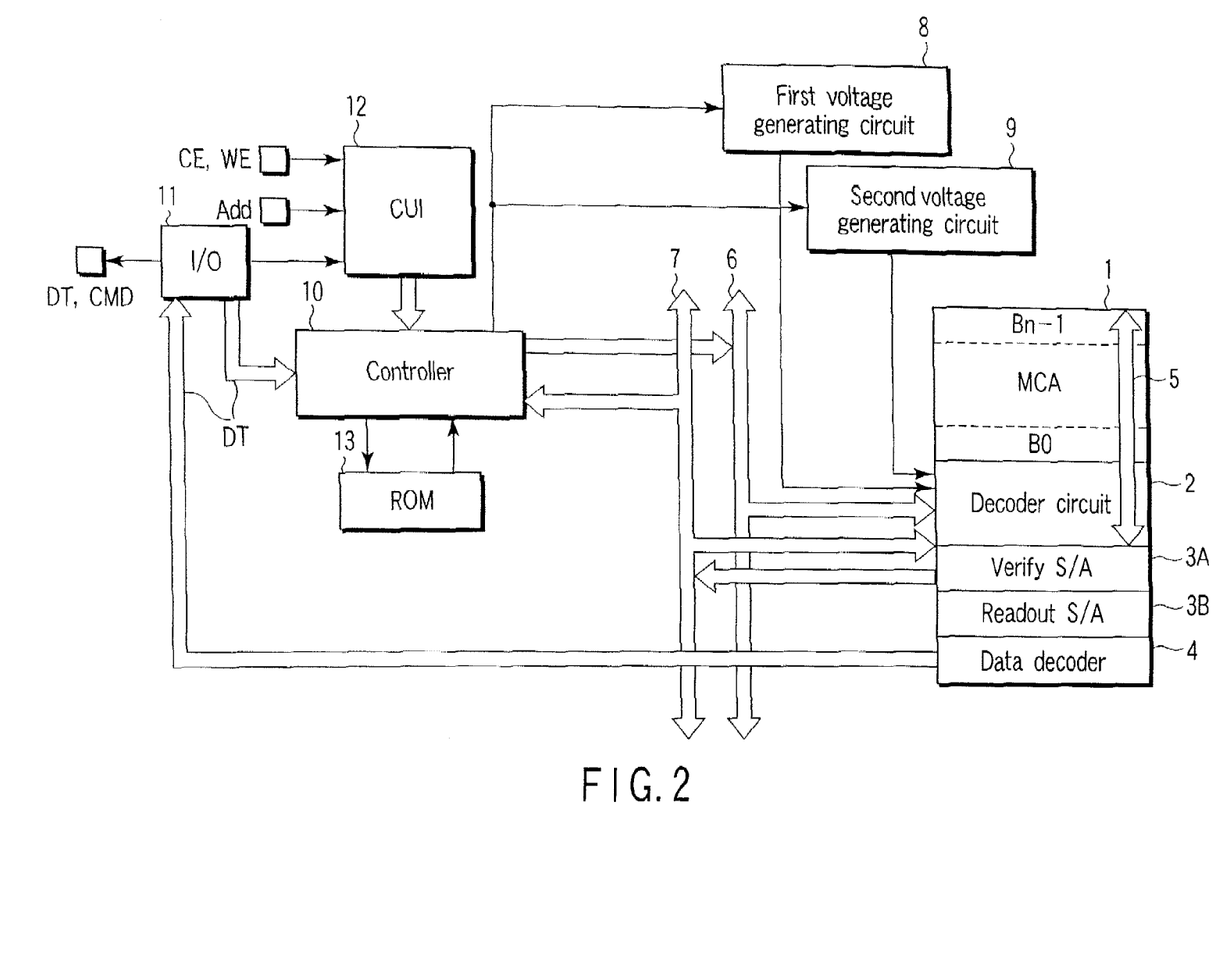
FIG. 2 is a schematic block diagram depicting a flash memory for storing multi-valued data applied to the first embodiment.

First, with reference to FIG. 2, FIG. 3, and FIG. 4, a description will be given with respect to a schematic configuration of a flash memory for storing multi-valued data applied to a first embodiment. As shown in FIG. 2, a memory cell array (MCA) 1 has n blocks B0 to Bn−1. Each of the blocks B0 to Bn−1 is a minimum unit of data erasing. The memory cell array 1 has a decoder circuit 2 for selecting a memory cell, a verify sense amplifier (S/A) 3A, a readout sense amplifier (S/A) 3B, and a data decoder 4. In addition, a data line 5 is allocated in common to each of the blocks B0 to Bn−1 of the memory cell array 1.

The decoder circuit 2 is connected to an address bus 6. This decoder circuit selects a word line (row line) and a bit line (column line) and selects a memory cell in response to an address signal supplied from a controller 10.

Input ends of the verify sense amplifier 3A and readout sense amplifier 3B each are connected to the data line 5. In the case where four-valued, two-bit data is stored in a memory cell, for example, the verify sense amplifier 3A and the readout sense amplifier 3B each generate three reference currents, and thus, have a reference current generating circuit using at least one reference cell. These sense amplifiers 3A and 3B each compare a reference current supplied from the reference current generating circuit and a current flowing to a selected memory cell with each other.

An output end of the verify sense amplifier 3A is connected to a data bus line 7. This sense amplifier detects a signal read out from a memory cell at the time of data writing or erasing, and supplies the detected signal to the controller 10. An output end of the readout sense amplifier 3B is connected to the data decoder 4. The data decoder 4 decodes a signal supplied from the readout sense amplifier 3B, and generates an output signal. An output end of the data decoder 4 is connected to an input/output section (I/O) 11. The signal outputted from the data decoder 4 at the time of data readout is outputted to the outside via the input/output section 11.

The address bus line 6 and the data bus line 7 are connected to the controller 10. The input/output section 11, a command user interface (CUI) 12, a ROM 13, and first and second voltage generating circuits 8 and 9 are connected to the controller 10. The input/output section 11 supplies a command CMD supplied from the outside to the CUI 112, and supplies memory cell write data to the controller 10. Further, the input/output section 11 outputs to the outside the readout data supplied from the readout sense amplifier 4.

In addition, the CUI 12 receives signals such as a chip enable signal CE inputted from the outside, a write enable signal WE, and an address signal Add, processes these signals, and supplies the processed signals to the controller 10. The ROM 13 stores a variety of programs for controlling an operation of the controller 10. The controller 10 controls an operation of a whole flash memory in response to the command CMD and programs. That is, this controller supplies an address signal to the address bus line 6, and supplies write data to the data bus line 7. Further, the controller 10 controls the first and second voltage generating circuits 8 and 9 at the time of data writing, at the time of verifying, at the time of readout, and at the time of erasure, and generates a predetermined voltage. The first voltage generating circuit 8 generates a voltage supplied to a control gate of a memory cell, i.e., a word line voltage, at the time of data writing, at the time of verifying, and at the time of readout. This word line voltage is supplied to a word line via a row main decoder and a row pre-decoder in the decoder circuit 2. In addition, the second voltage generating circuit 9 generates a drain voltage supplied to a drain of a memory cell at the time of data writing. This drain voltage is supplied to the drain of a memory cell via a column pre-decoder and a column gate of the decoder circuit 2.

Figure 3:
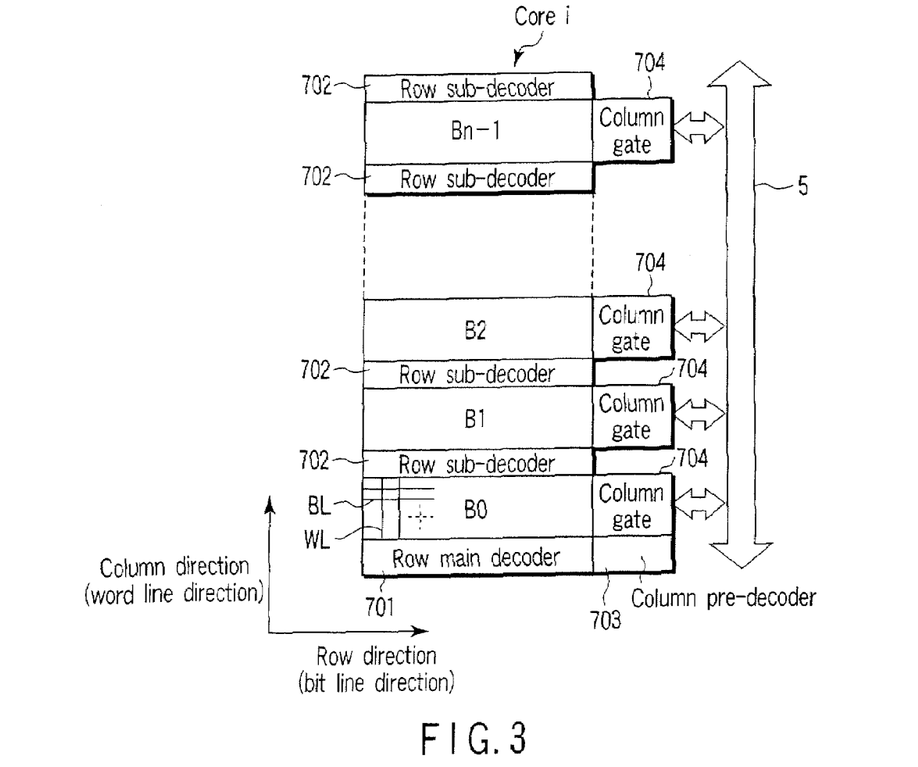
FIG. 3 is a view of a configuration showing a memory cell array shown in FIG. 2.

FIG. 3 shows a configuration of the memory cell array 1. A row main decoder 701 for selecting a word line WL is allocated at an end of an array of blocks B0 to Bn−1, and a row sub-decoder 702 for selecting a block is allocated between blocks. A column decoder is allocated at an end of a bit line BL of each of blocks B0 to Bn−1, and is configured by column gates 704 and a column pre-decoder 703 for selecting a bit line BL. The column gates 705 are connected to the data line 5. The row main decoder 701 and the column pre-decoder 703 are allocated in the decoder circuit 2 shown in FIG. 2.

Figure 4:
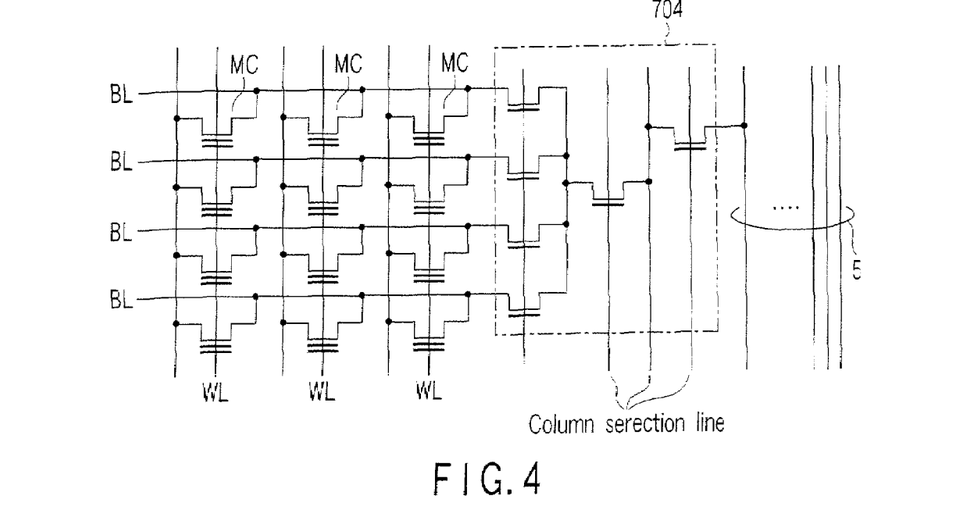
FIG. 4 is a circuit diagram depicting a configuration of each block shown in FIG. 2.

FIG. 4 shows a configuration of each of blocks B0 to Bn−1. As shown in FIG. 4, this flash memory is provided as a NOR type flash memory, for example. A plurality of bit lines BL and word lines WL are arranged so as to intersect each other, and memory cells MC are arranged on the intersecting portion of the bit line BL and the word line WL. The memory cell MC is composed of EEPROM cells, for example. A drain of the memory cells MC allocated to each column is connected to the corresponding bit line BL, a control gate of the memory cells allocated to each row is connected to the word line WL, and sources are connected to a common source line, respectively.

First Embodiment

Figure 1:
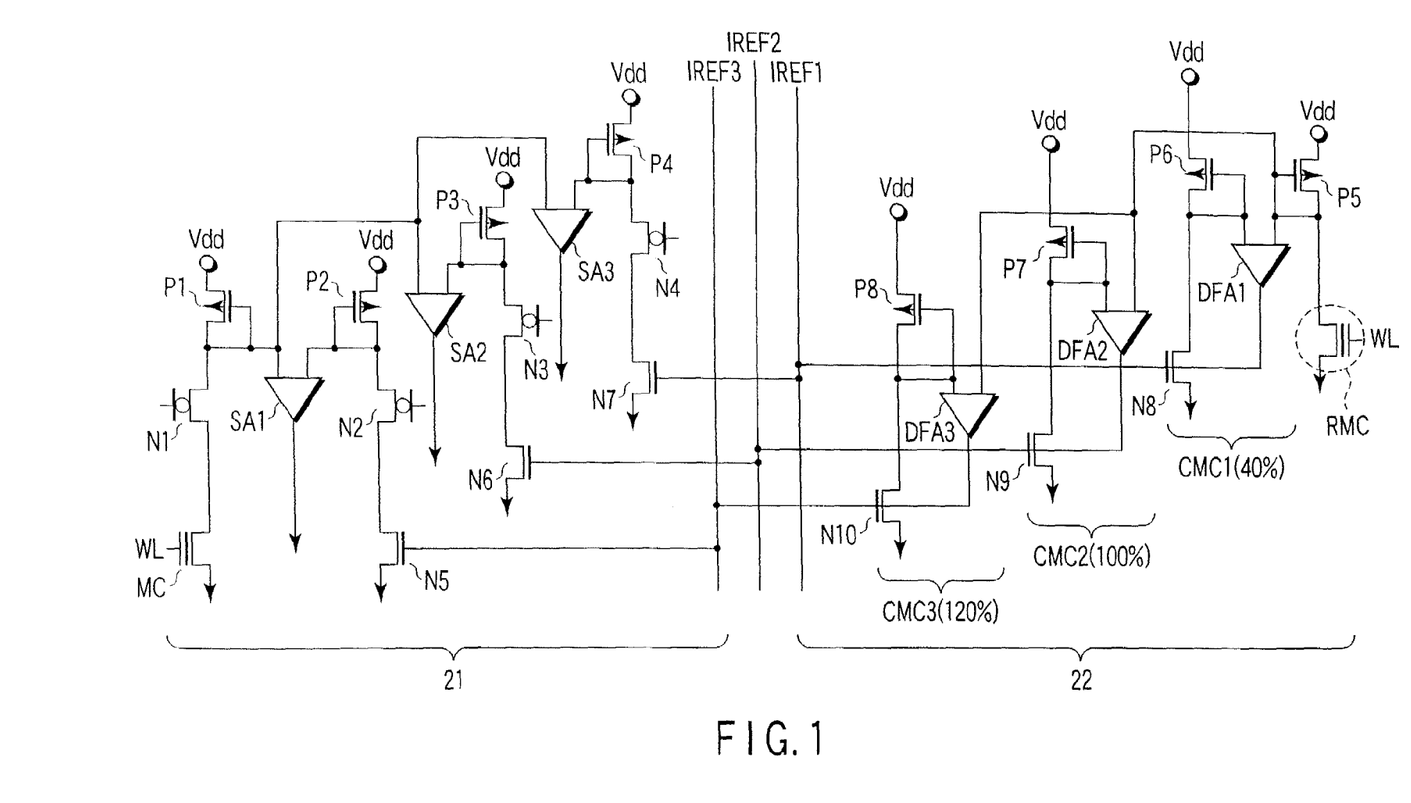
FIG. 1 is a circuit diagram depicting a sense amplifier in accordance with an Iref mirror system according to a first embodiment.

FIG. 1 shows a sense amplifier in accordance with an Iref mirror system according to a first embodiment. This sense amplifier can be applied to both of a verify sense amplifier 3A and a readout sense amplifier 3B shown in FIG. 2.

A sense amplifier circuit 21 for detecting multi-valued data shown in FIG. 1 detects a reference current generated by a reference current generating circuit 22 and a current that flows to a memory cell MC. The reference current generating circuit 22 has one reference memory cell RMC and three current mirror circuits CMC1, CMC2, and CMC3. The current mirror circuits CMC1, CMC2, and CMC3 each have a mirror rate that is different from another one, and generates three reference currents IREF1, IREF2, and IREF3 from a current that flows to the reference memory cell RMC. The sense amplifier circuit 21 compares these reference currents IREF1, IREF2, and IREF3 with the current of the memory cell MC.

The sense amplifier circuit 21 has three sense amplifiers SA1, SA2, and SA3, for example. One input end of each of the sense amplifiers SA1, SA2, and SA3 is connected to a memory cell MC selected via an N-channel MOS transistor (hereinafter, referred to as NMOS) N1, and further, is connected to a node supplied with a power supply voltage Vdd via a P-channel MOS transistor (hereinafter, referred to as PMOS) P1 serving as a load.

In addition, the other input end of each of the sense amplifiers SA1, SA2, and SA3 is grounded via NMOSN2, N5, N3, N6, N4, and N7 interconnected in series. Further, the other input end of each of the sense amplifiers SA1, SA2, and SA3 is connected to a node supplied with a power supply voltage Vdd via PMOSP2, P3, and P4, each of which serves as a load.

NMOSN1, N2, N3, and N4 are provided as transistors whose threshold voltages are set to 0 V, for example, and a constant voltage for turning ON NMOSN1, N2, and N3, for example, is supplied to a gate of each of NMOSN1, N2, N3, and N4. In addition, the reference currents IREF3, IREF2, and IREF1 generated by means of the reference current generating circuit 22 are supplied to gates of NMOSN5, N6, and N7, respectively.

In the reference current generating circuit 22, one input end of each of differential amplifiers DFA1, DFA23, and DFA3 is connected to a reference memory cell RMC, and further, is connected to a node supplied with a power supply voltage Vdd via PMOSP35 serving as a load.

In addition, the other input end of each of the differential amplifiers DFA1, DFA2, and DFA3 are grounded via NMOSN8, N9, and N10, respectively. Further, the other input end of each of the differential amplifiers DFA1, DFA2, and DFA3 is connected to a node supplied with a power supply voltage Vdd via PMOSP6, P7, and P8, each of which serves as a load. An output end of each of the differential amplifiers DFA1, DFA2, and DFA3 is connected to a gate of each of the corresponding NMOSN8, N9, and N10 and each of the NMOSN7, N6, and N5. Reference currents IREF1, IREF2, and IREF3 are outputted, respectively, from output ends of the differential amplifiers DFA1, DFA2, and DFA3.

In the above configuration, a threshold voltage of a reference memory cell RMC is set at an electric potential between data "10" and "01" stored in a memory cell MC, for example. The current mirror circuits CMC1, CMC2, and CMC3 are set to 40%, 100%, and 120%, respectively, in mirror ratio, for example. This mirror ratio is set by a ratio between a channel width of PMOSP5, for example, and a channel width of each of PMOSP6, P7, and P8. With such a configuration, three types of reference currents IREF1, IREF2, and IREF3 can be generated.

In the case where the above-described sense amplifier 21 is operated as a data readout sense amplifier 3B, the sense amplifiers SA1, SA2, and SA3 configuring a sense amplifier circuit 21 each compare a current that flows to a memory cell MC and each of the reference currents IREF1, IREF2, and IREF3. An output signal of each of the sense amplifiers SA1, SA2, and SA3 is set at a high level or a low level in response to the reference currents IREF1, IREF2, and IREF3 and the current that flows to the memory cell MC. The output signals of the sense amplifiers SA1, SA2, and SA3 are supplied to the data decoder 4, and the supplied signals are converted to four-valued, two-bit data.

Figure 5:
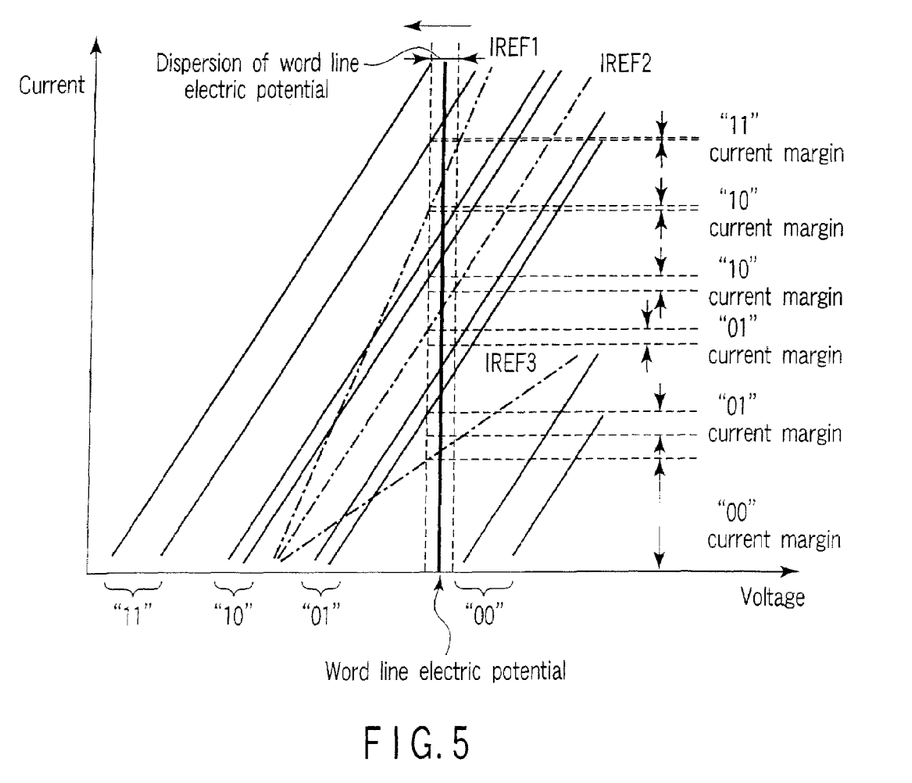
FIG. 5 is a view showing characteristics of a sense amplifier in accordance with an Iref mirror system.

On the other hand, in the case where the above-described sense amplifier circuit 21 is operated as a data readout sense amplifier 3B, a first voltage generating circuit 8 changes an electric potential of a word line connected to a selected memory cell under the control of a controller 10. That is, as shown in FIG. 5, when data "01" is verified, the electric potential of the word line is lowered more significantly than when data "11" and "10" is verified, for example. Thus, it becomes possible to allocate a current margin when reading out data "11" and "10" by using a reference current generating circuit 22 composed of one reference memory cell RMC and three current mirror circuits CMC1, CMC2, and CMC3.

According to the first embodiment described above, in a sense amplifier of an Iref mirror system, in the reference current generating circuit 22 composed of one reference memory cell RMC and the three current mirror circuits CMC1, CMC2, and CMC3, reference currents IREF1, IREF2, and IREF3 are generated by changing a mirror ratio of the current mirror circuits CMC1, CMC2, and CMC3. Therefore, three reference currents can be generated by means of one reference memory cell RMC, and thus, at the time of manufacture, a time required for adjustment of a threshold voltage of the reference memory cell RMC can be reduced.

Moreover, in the case where the sense amplifier circuit 21 according to the first embodiment has been used as a verify sense amplifier 3A, in the case where data "11", "10", and "01" are stored, an electric potential of a word line of a memory cell MC is set to be lower than an electric potential of a word line at the time of readout. In the case where data "00" is stored, the above electric potential is set to be higher. Thus, a current margin at the time of readout is guaranteed by means of a sense amplifier of an Iref mirror system.

Second Embodiment

Figure 6:
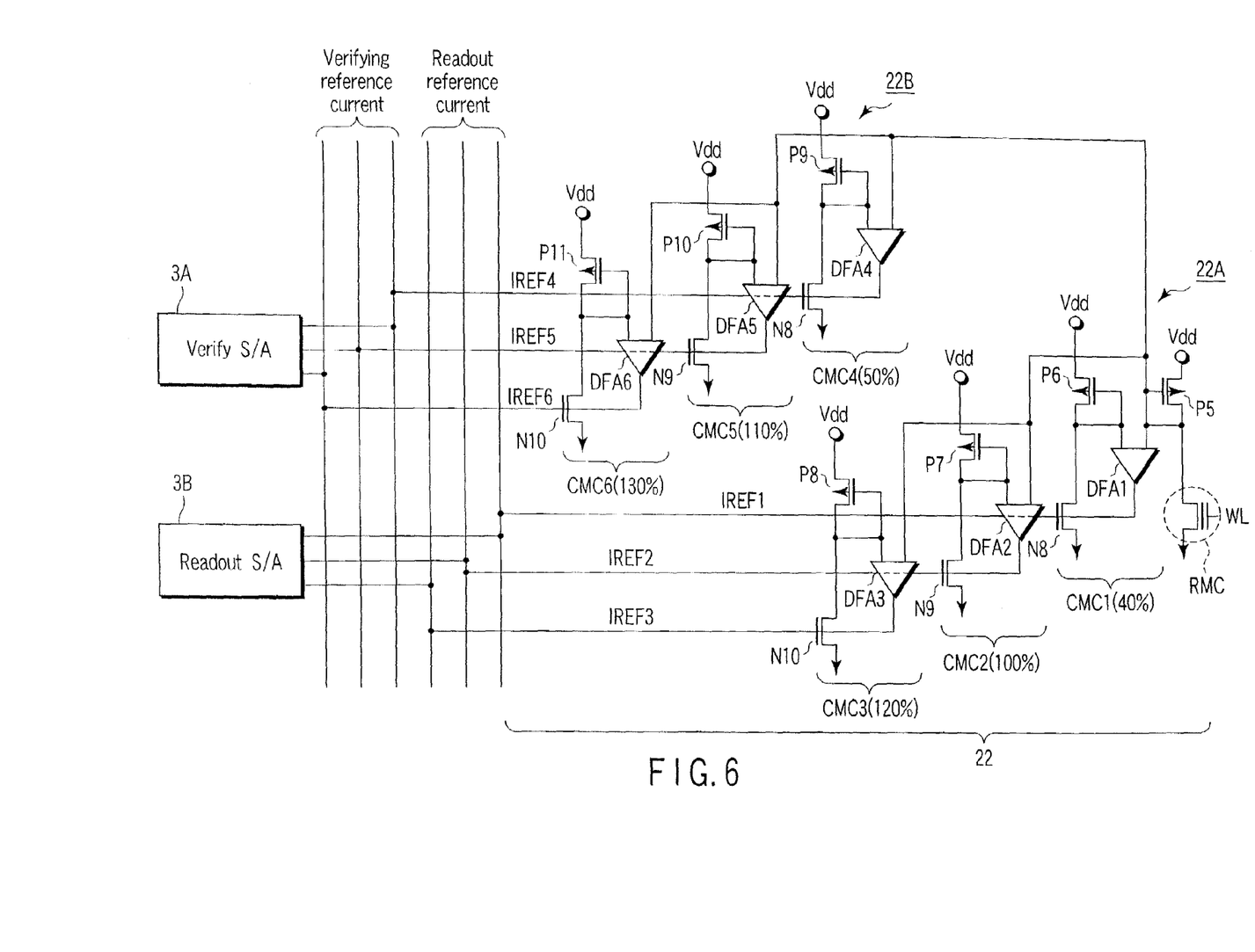
FIG. 6 is a circuit diagram depicting a reference current generating circuit according to a second embodiment.

FIG. 6 shows only a reference current generating circuit according to a second embodiment. In FIG. 6, like constituent elements are designated by like reference numerals.

The sense amplifier 21 according to the first embodiment has the reference current generating circuit 22; has used the current generated by means of the reference current generating circuit 22 at the time of readout and at the time of verifying; and has changed the electric potential of the word line of the selected memory cell at the time of verifying.

In contrast, a reference current generating circuit 22 according to the second embodiment has a readout reference current generating circuit 22A and a verifying reference current generating circuit 22B. Readout reference currents IREF1, IREF2, and IREF3 generated by means of the readout reference current generating circuit 22A are supplied to a sense amplifier 3B, and verifying reference currents IREF4, IREF5, and IREF6 generated by means of the verifying reference current generating circuit 22B are supplied to the verify sense amplifier 3A.

A configuration of the readout reference current generating circuit 22A is identical to that according to the first embodiment. The verifying reference current generating circuit 22B has a configuration identical to the readout reference current generating circuit 22A, and is composed of current mirror circuits CMC4, CMC5, and CMC6, each of which supplies a current proportional to a current that flows to a reference memory cell RMC. The current mirror circuits CMC4, CMC5, and CMC6 are composed of differential amplifiers DFA4, DFA5, and DFA6 and NMOSN8, N9, and N10, and PMOSP9, P10, and P11, respectively. A mirror rate of the current mirror circuits CMC4, CMC5, and CMC6 are set to 50%, 110%, and 130%, respectively, for example.

According to the second embodiment, in a sense amplifier of an Iref mirror system, one reference memory cell is provided in a memory. From the current that flows to this reference memory cell RMC, readout reference currents IREF1, IREF2, and IREF3 are generated by using the current mirror circuits CMC1, CMC2, and CMC3, and verifying reference currents IREF4, IREF5, and IREF6 are generated by using the current mirror circuits CMC4, CMC5, and CMC6. Therefore, the readout reference currents IREF1, IREF2, and IREF3 and the verifying reference currents IREF4, IREF5, and IREF6 can be generated from one reference memory cell RMC, and thus, a time required for adjustment of the reference memory cell can be reduced.

In addition, optimal reference currents IREF1 to IREF6 are set by means of the current mirror circuits CMC1 to CMC6, respectively. Thus, a sufficient current margin can be allocated in readout of each item of data by mean of a sense amplifier of an Iref mirror system.

Third Embodiment

In the above-described first and second embodiments, in the sense amplifier of the Iref mirror system, a plurality of reference currents has been generated by means of one reference memory cell and a plurality of current mirror circuits each having a mirror rate different from another one.

Figure 7:
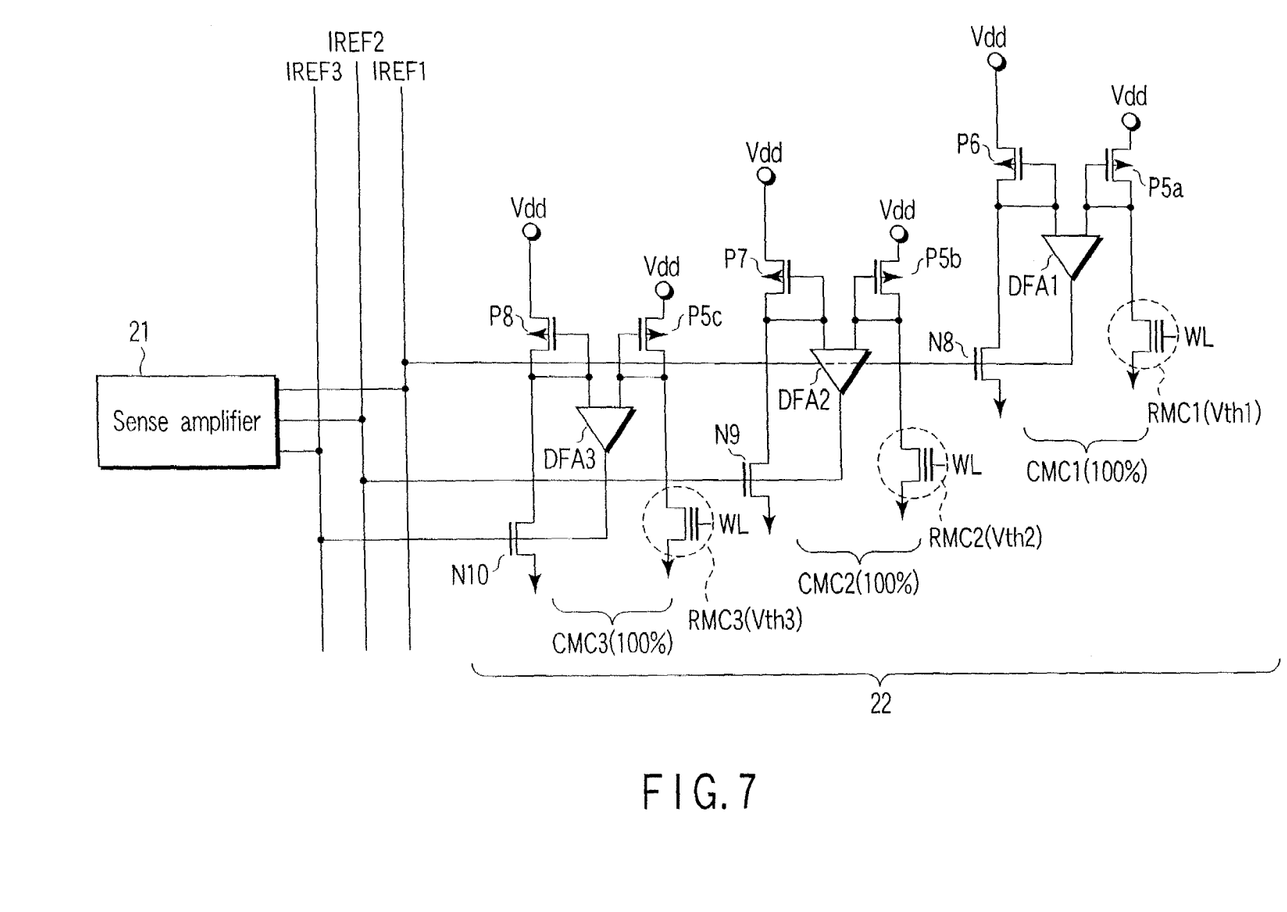
FIG. 7 is a circuit diagram depicting a reference current generating circuit according to a third embodiment.

In contrast, according to a third embodiment, as shown in FIG. 7, a plurality of reference currents IREF1, IREF2, and IREF3 are generated by means of a plurality of reference memory cells RMC1, RMC2, and RMC3 and a plurality of current mirror circuits CMC1, CMC2, and CMC3 whose number is equal to that of the reference memory cells, the current mirror circuits each having a mirror ratio equal to another one. That is, one input end of each of differential amplifiers DFA1, DFA2, and DFA3 is connected to each of the reference memory cells RMC1, RMC2, and RMC3, and further, is connected to a node supplied with a power supply voltage Vdd via PMOSP5a, P5b, and P5c. Other constituent elements are identical to those according to the first and second embodiments.

All of the mirror ratios of the current mirror circuits CMC1, CMC2, and CMC3 are set to 100%, for example, and threshold voltages Vth1, Vth2, and Vth3 of the reference memory cells RMC1, RMC2, and RMC3 are set among the threshold voltage distributions that correspond to each item of data, for example, respectively.

According to the third embodiment described above as well, a plurality of reference currents IREF1, IREF2, and IREF3 can be generated. In this case, a work time for setting predetermined threshold voltages of the reference memory cells RMC1, RMC2, and RMC3 is longer as compared with those according to the first and second embodiments. However, a sense current margin relevant to threshold value fluctuation of memory cells due to a temperature or fluctuation of a word line electric potential can be allocated more significantly.

Figure 8:
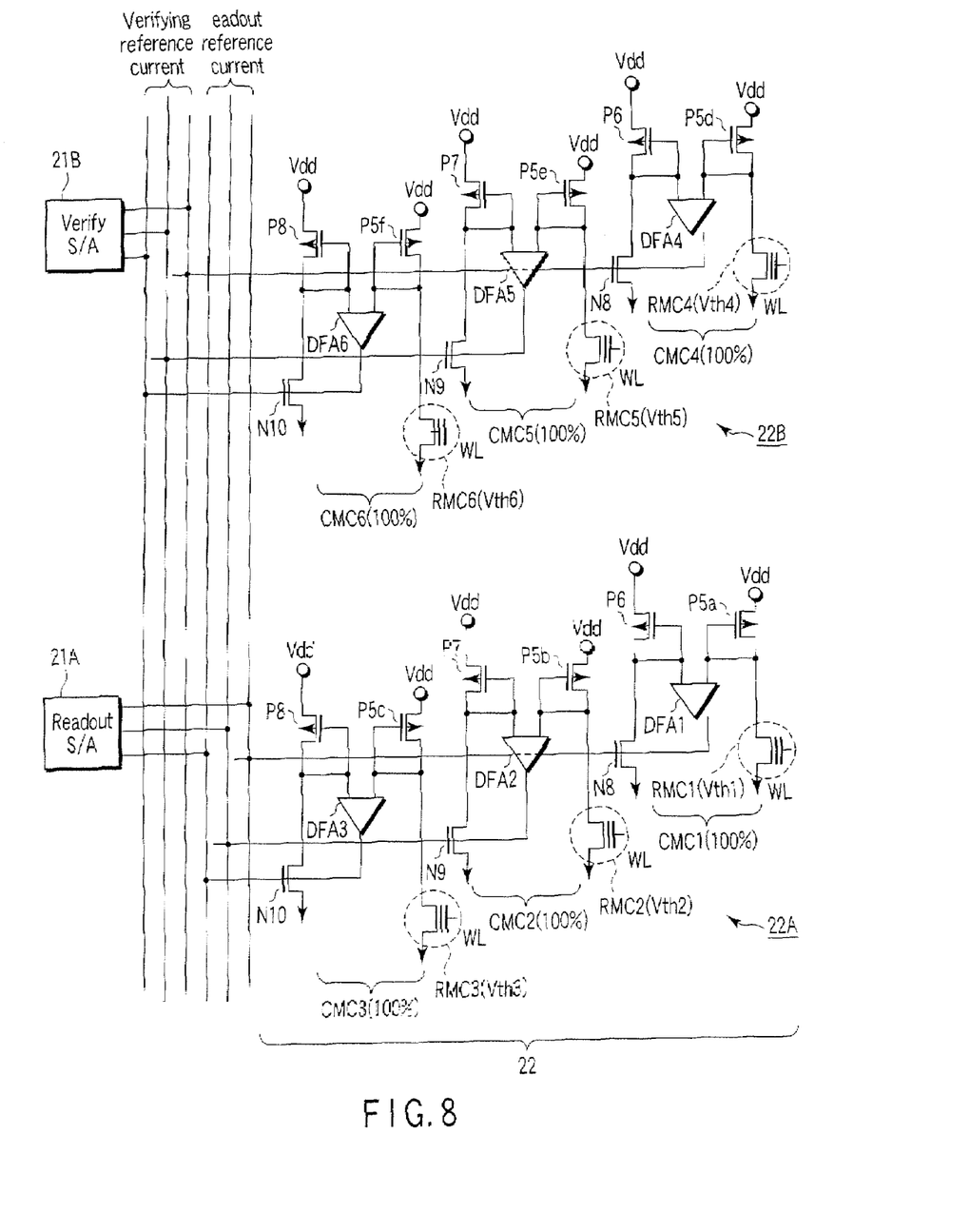
FIG. 8 is a circuit diagram depicting a reference current generating circuit according to a modified example of the third embodiment.

FIG. 8 shows a modified example of the third embodiment. In this modified example, a reference current generating circuit 22 has a readout reference current generating circuit 22A and a verifying reference current generating circuit 22B. A configuration of the readout reference current generating circuit 22A is identical to that shown in FIG. 7. Thus, only the verifying reference current generating circuit 22B will be described here. The verifying reference current generating circuit 22B is composed of a plurality of reference memory cells RMC5, RMC6, and RMC7 and a plurality of current mirror circuits CMC4, CMC5, and CMC6 whose number is equal to that of the reference memory cells, the current mirror circuits each having a mirror rate equal to another one. One input end of each of the differential amplifiers DFA4, DFA5, and DFA6 configuring the current mirror circuits CMC4, CMC5, and CMC6 is connected to each of the reference memory cells RMC4, RMC5, and RMC6, and further, is connected to a node supplied with a power supply voltage Vdd via PMOSP5d, P5e, and P5f. A configuration of the other input end of each of the differential amplifiers DFA4, DFA5, and DFA6 is identical to that according to the third embodiment.

All of the mirror ratios of the current mirror circuits CMC1, CMC2, and CMC3 are set to 100%, for example. The threshold voltages Vth4, Vth5, and Vth6 of the reference memory cells RMC4, RMC5, and RMC6 are set at the lowest threshold voltages in each one of the threshold voltage distributions that correspond to each item of data, for example. Output currents of the differential amplifiers DFA1, DFA2, and DFA3 configuring the readout reference current generating circuit 22A are supplied to the readout sense amplifier 21A, and output currents of the differential amplifiers DFA4, DFA5, and DFA6 configuring the verifying reference current generating circuit 22B are supplied to the verify sense amplifier 21B.

According to the above modified example, as is the case with the readout reference current generating circuit 22A, the verifying reference current generating circuit 22B also generates a verifying reference current based on a current that flows to a reference memory cell having a threshold voltage different from another one. Thus, as in the third embodiment, a sense current margin relevant to threshold value fluctuation due to a temperature or fluctuation of a word line electric potential can be allocated more significantly.

Fourth Embodiment

Figure 9:
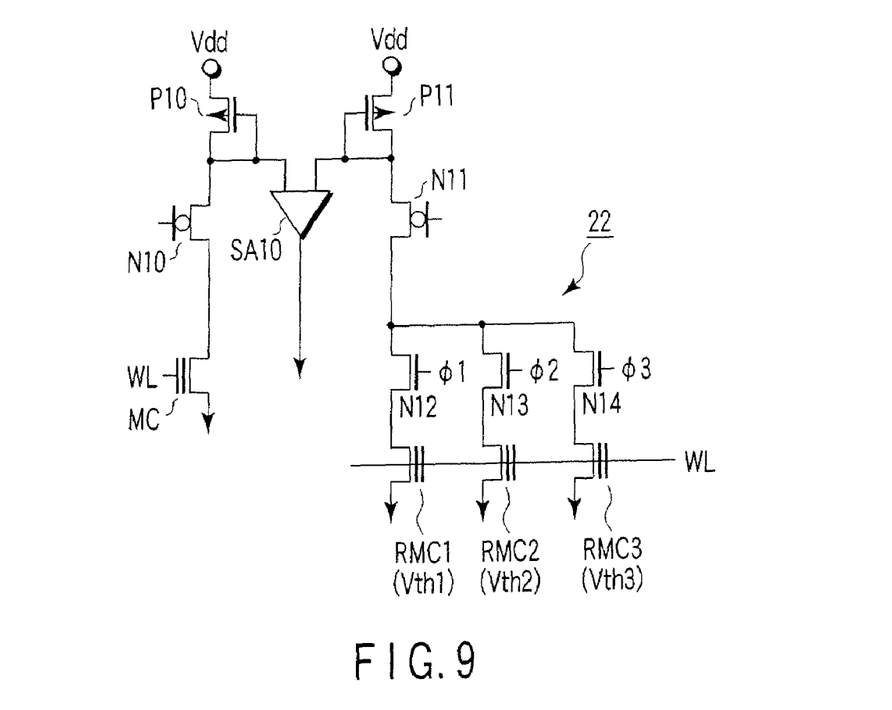
FIG. 9 is a circuit diagram depicting a sense amplifier in accordance with an Iref direct coupling system according to a fourth embodiment.

FIG. 9 shows a fourth embodiment and a sense amplifier of an Iref direct coupling system.

In FIG. 9, one input end of a sense amplifier SA10 is connected to a memory cell MC selected via NMOSN10, and further, is connected to a node supplied with a power supply voltage Vdd via PMOSP10 serving as a load. In addition, one end of NMOSN11 is connected to the other input end of the sense amplifier 10. The other end of NMOSN11 is connected to one end of each of NMOSN12, N13, and N14. The other end of each of these NMOSN12, N13, and N14 is connected to each one of reference memory cells RMC1, RMC2, and RMC3. Readout threshold voltages Vth1, Vth2, and Vth3 are set in these reference memory cells RMC1, RMC2, and RMC3, respectively, for example. Further, the other input end of the sense amplifier SA10 is connected to a node supplied with a power supply voltage Vdd via PMOSP11.

Figure 10:
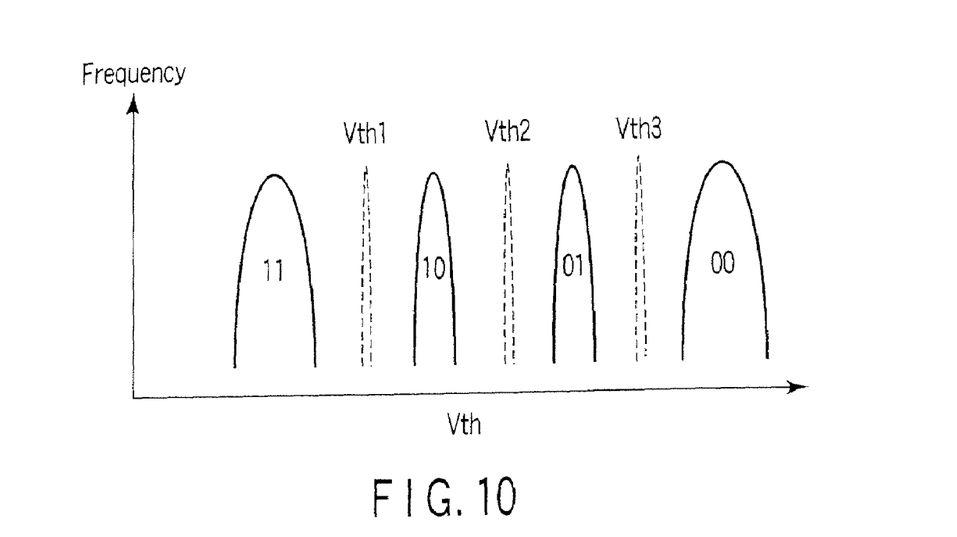
FIG. 10 is a view showing a relationship between a threshold voltage set in a reference memory cell and a threshold voltage that corresponds to data.

FIG. 10 shows a relationship between threshold voltages Vth1, Vth2, and Vth3 set in the reference memory cells RMC1, RMC2, and RMC3 and threshold voltages that correspond to data.

In the above configuration, the same voltage is supplied via a word line WL to a control gate of a selected memory cell MC and reference memory cells RMC1 to RMC3 at the time of data readout. In this state, first, NMOSN13 is made conductive in response to a signal $\phi 2$, for example. In this state, a current that flows to a reference memory cell RMC2 and a current that flows to a memory cell MC are detected by means of the sense amplifier SA10. Then, in the case where a signal "0" is outputted from the sense amplifier SA10, NMOSN12 is made conductive in response to a signal $\phi 1$. In the case where a signal "1" is outputted, NMOSN14 is made conductive in response to a signal $\phi 3$. In this way, a current that flows to a reference memory cell RMC1 or RMC3 and a current that flows to the memory cell MC are detected by means of the sense amplifier SA10. Two-bit data is generated by means of a signal outputted from the sense amplifier SA10 in response to the signal $\phi 2$ and a signal outputted from the sense amplifier 10SA in response to the signal $\phi 1$ or $\phi 3$.

At the time of verifying, as in the first embodiment, an electric potential of a word line of a selected memory cell MC is changed, and a threshold voltage of the memory cell is verified. In this way, a margin is allocated by comparing a current that flows to a memory cell in response to each item of write data and a readout reference current.

According to the fourth embodiment described above, reference memory cells RMC1, RMC2, and RMC3 are sequentially connected via NMOSN12, N13, and N14 to the other end of the sense amplifier SA10, and currents that flow to the reference memory cells RMC1, RMC2, and RMC3 and the current that flows to a memory cell MC are compared with each other by means of the sense amplifier SA10. Thus, in an Iref direct coupling system, multi-valued data can be detected without increasing the number of sense amplifiers.

Moreover, the Iref direct coupling system has an advantage that a current margin can be uniformed with respect to each one item of multi-valued data, as compared with a sense amplifier of an Iref mirror system. That is, in the case of the Iref mirror system, three reference voltages are generated by using one reference memory cell and three current mirror circuits, as described previously. That is, three voltage/current characteristics having different gradients with respect to four items of data are set by changing a mirror rate of a current mirror. The gradients of these voltage/current characteristics are different from gradients of the voltage/current characteristics of memory cells. Thus, it becomes difficult to uniform a current margin relevant to threshold value fluctuation due to a temperature or fluctuation of a word line electric potential and the like.

Figure 11:
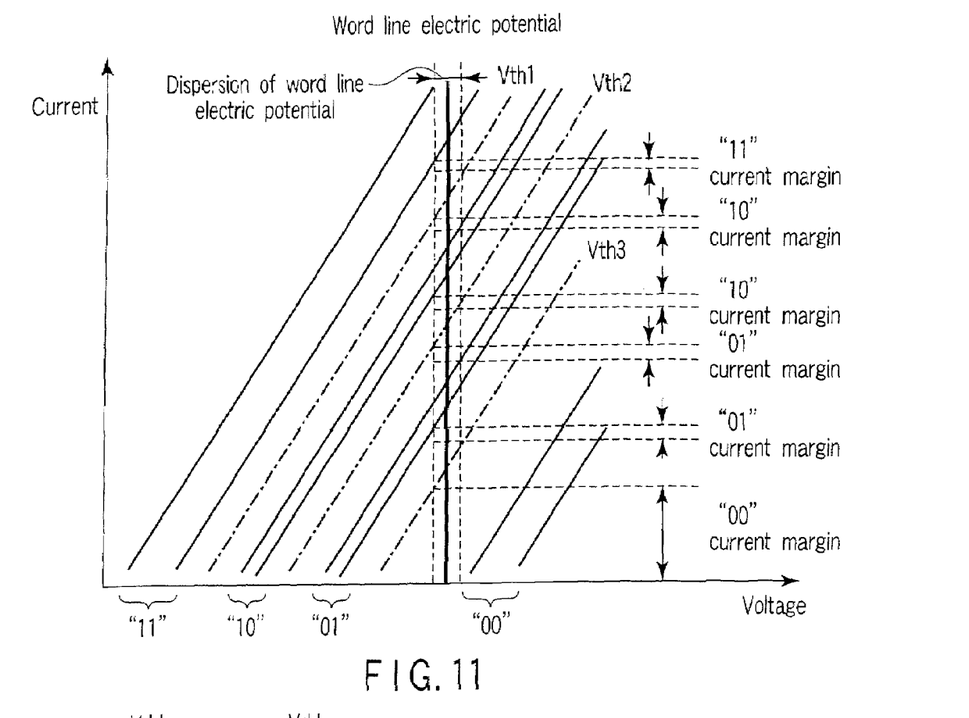
FIG. 11 is a view showing characteristics of the sense amplifier in accordance with the Iref direct coupling system.

In contrast, as shown in FIG. 11, in the case of a sense amplifier of an Iref direct coupling system, the gradients of the voltage/current characteristics of three reference memory cells are substantially equal to gradients of the voltage/current characteristics of memory cells. Thus, a current margin relevant to threshold value fluctuation of memory cells due to a temperature or fluctuation of a word line electric potential and the like can be uniformed.

Fifth Embodiment

Figure 12:
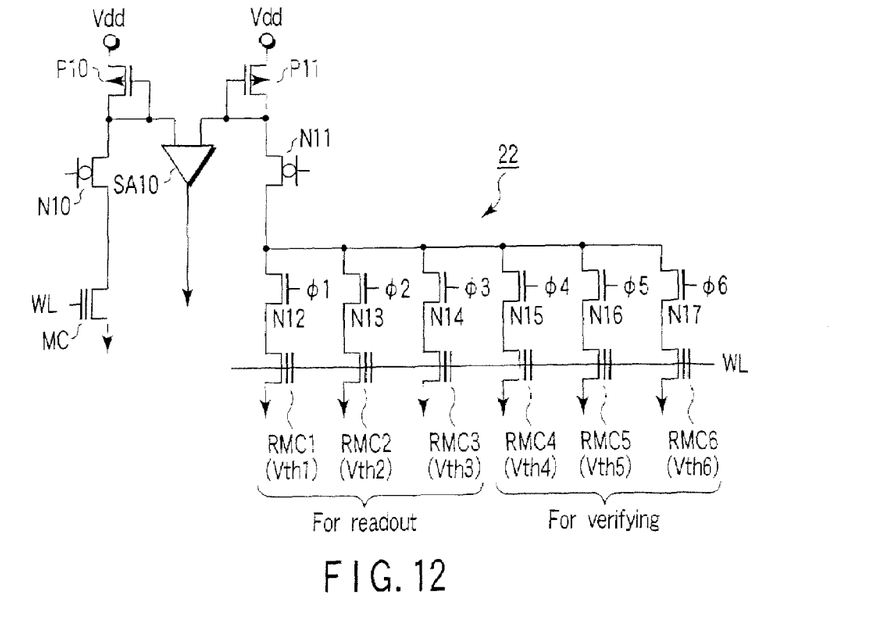
FIG. 12 is a circuit diagram depicting a sense amplifier in accordance with an Iref direct coupling system according to a fifth embodiment.

FIG. 12 shows a fifth embodiment having modified the fourth embodiment. In FIG. 12, like constituent elements shown in FIG. 9 are designated by like reference numerals.

As shown in FIG. 12, in addition to readout reference memory cells RMC1, RMC2, and RMC3, for example, there are provided three verifying reference memory cells RMC4, RMC5, and RMC6. These verifying reference memory cells RMC4, RMC5, and RMC6 are connected to NMOSN15, N16, and N17, and are connected to the sense amplifier 10SA by selectively turning ON these NMOSN15, N16, and N17 in response to signals $\phi 4$, $\phi 5$, and $\phi 6$. Verifying threshold voltages Vth4, Vth5, and Vth6 are set in the verifying reference memory cells RMC4, RMC5, and RMC6, respectively, and verifying reference currents are generated by these verifying reference memory cells RMC4, RMC5, and RMC6.

According to the fifth embodiment described above, in addition to the readout reference memory cells RMC1, RMC2, and RMC3, there are provided verifying reference memory cells RMC4, RMC5, and RMC6, and the readout reference currents and the verifying reference currents are generated by means of these reference memory cells. In this manner, verifying can be carried out without changing a word line electric potential at the memory cell side.

In this case, an output signal of the sense amplifier SA10 is supplied to a data decoder at the time of data readout, and is supplied to a CPU, for example, at the time of verifying.

Sixth Embodiment

Figure 13:
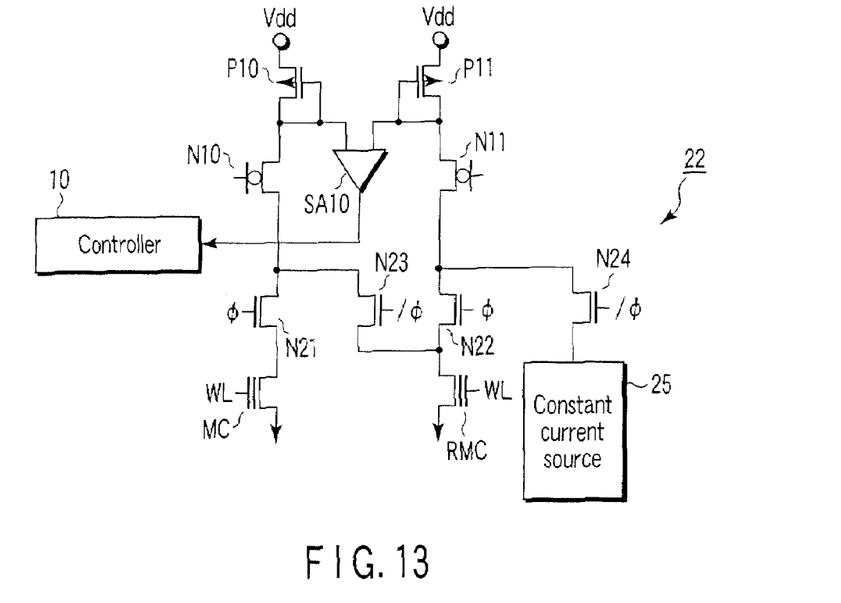
FIG. 13 is a circuit diagram depicting a sense amplifier in accordance with an Iref direct coupling system including an adjusting circuit of a reference memory cell according to a sixth embodiment.

FIG. 13 shows a sixth embodiment. According to the sixth embodiment, a threshold voltage of a reference memory cell can also be adjusted in a sense amplifier of an Iref direct coupling system shown in FIG. 9 and FIG. 12.

As shown in the fifth embodiment described above, in the case where the Iref direct coupling system has been selected, an increasing number of reference memory cells are connected to one sense amplifier. Thus, it is necessary to reduce a time for adjusting the reference memory cells and to compress the dispersion of the threshold voltages.

In the meantime, there is a need for a flash memory to control an applied voltage with respect to a memory cell in a complicated manner in data writing and erasing. Thus, the flash memory has a controller incorporated therein, and carried out complicated voltage control by means of this controller. Thus, only a command and data are supplied from the outside to the flash memory, whereby a required write or erase operation is executed. In general, such an operation is called auto execution.

At the time of auto execution, in data writing and erasing, the controller compares a current that flows to a memory cell selected by using a sense amplifier, as described above, with a current that flows to a reference memory cell, and verifies a threshold voltage of the memory cell. In the case of auto execution, there is no need for making control from the outside, thus enabling a high speed operation.

Therefore, according to the sixth embodiment, an adjustment time can be remarkably reduced by applying auto execution to adjustment of a reference memory cell.

As shown in FIG. 13, NMOSN21 is connected between NMOSN10 and a memory cell MC, and NMOSN22 is connected between NMOSN11 and a reference memory cell RMC. Further, NMOSN23 is connected between a connection node of NMOSN10 and N21 and a connection node of NMOSN22 and a reference memory cell RMC. In addition, one end of NMOSN24 is connected to a connection node of NMOSN11 and N22, and a constant current source 25 is connected to the other end of this NMOSN24. A signal $\phi$ is supplied to a gate of each of NMOSN21 and N22, and an inverted signal/$\phi$ is supplied to a gate of each of NMOSN23 and N24. The signal $\phi$ is set at a high level at the time of normal operation, and is set at a low level at the time of adjustment. In addition, at the time of adjustment of a reference memory cell RMC, an output signal of a sense amplifier SA10 is supplied to a controller 10 shown in FIG. 2. Only one reference memory cell is shown for the purpose of simplification.

In the above-described configuration, when a command for adjusting a reference memory cell RMC from the outside and data for setting a threshold voltage are supplied to the controller 10 via an I/O 11, the controller 10 is set to an adjusting mode. Then, the controller 10 inverts the signal $\phi$ to a low level. Thus, NMOSN21 and N22 are turned OFF, and NMOSN23 and N24 are turned ON. In this state, a reference memory cell RMC is written in response to the data. This write operation is identical to a write operation for a memory cell MC. Next, the sense amplifier SA10 compares a current that flows to a reference memory cell RMC with a current that flows a constant current source 25. An output signal of the sense amplifier SA10 is supplied to the controller 10, and a threshold voltage of a reference memory cell RMC is verified. As a result, in the case where a required threshold voltage has not been reached, additional writing is executed. Such an operation is repeated until a predetermined threshold voltage has been reached.

The above-described operation is executed for all of the reference memory cells connected to the sense amplifier SA10.

Figure 14:
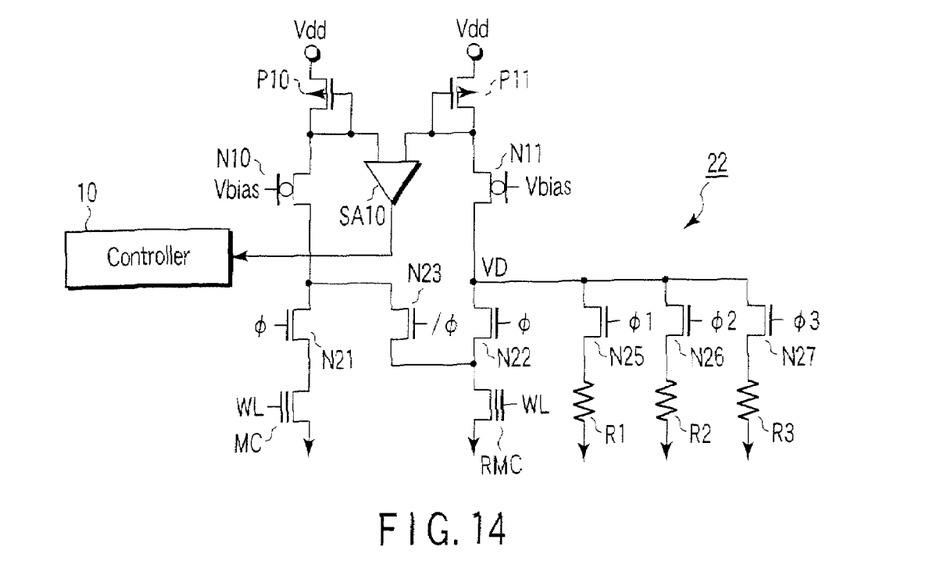
FIG. 14 is a circuit diagram depicting a modified example of FIG. 13.

FIG. 14 shows an example of a constant current source 25 shown in FIG. 13. This constant current source 25 is composed of: resistors R1, R2, and R3 having their different resistance values and NMOSN25, N26, and N27 for selecting these resistors R1, R2, and R3. Signals $\phi$1, $\phi$2, and $\phi$3 are supplied to gates of these NMOSN25, N26, and N27. The resistance values of the resistors R1, R2, and R3 are set in response to the threshold voltage set to a reference memory cell RMC, i.e., a current value supplied to the reference memory cell RMC. In such a configuration, ant one of the signals $\phi$1, $\phi$2, and $\phi$3 is set at a high level in response to the threshold voltage set to the reference memory cell RMC, one of the corresponding NMOSN25, N26, and N27 is turned ON. In this state, the sense amplifier SA10 detects a current that flows to the reference memory cell RMC and a current that flows to a selected resistor. Additional writing is controlled in response to this detected output signal, and a predetermined threshold voltage is set to the reference memory cell RMC.

According to the sixth embodiment described above, auto execution of a flash memory is applied to adjustment of a reference memory cell. Thus, it is possible to remarkably reduce a time required for adjusting a threshold voltage of a reference memory cell. Therefore, in the case where a sense amplifier of an Iref direct coupling system is applied to a multi-valued flash memory, even if the number of reference memory cells has been increased, a time for adjusting a reference memory cell can be remarkably reduced.

In addition, when adjusting a threshold voltage of a reference memory cell, the sense amplifier SA10 and PMOSP10 and P11 serving as a load of the sense amplifier are used. Therefore, the threshold voltage of the reference memory cell can be adjusted under a condition similar to an actual use state of the sense amplifier SA10, and thus, the threshold voltage of the reference memory cell can be adjusted with high precision.

Further, according to the sixth embodiment described above, the sense amplifier SA10 for detecting memory cell data can be utilized for adjusting the threshold voltage of the reference memory cell. Thus, there is no need for providing a dedicated sense amplifier for adjusting the threshold value of the reference memory cell. Therefore, area penalty can be restricted.

Seventh Embodiment

Figure 15:
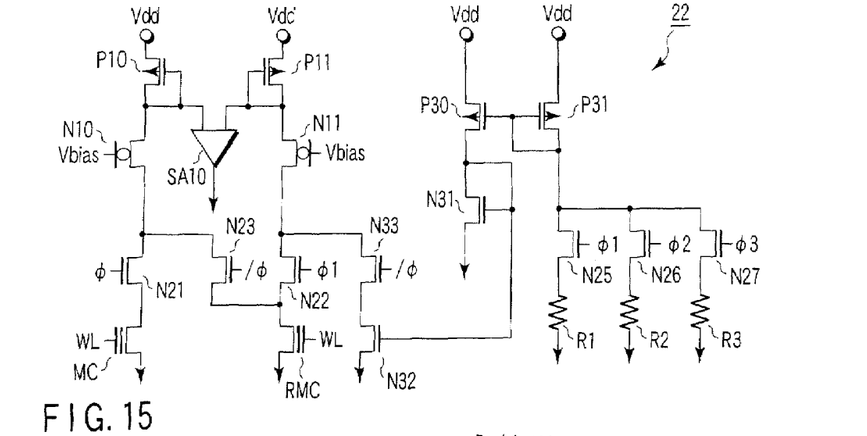
FIG. 15 is a circuit diagram depicting a sense amplifier in accordance with an Iref direct coupling system including an adjusting circuit of a reference memory cell according to a seventh embodiment.

FIG. 15 shows a seventh embodiment in which like constituent elements shown in FIG. 14 are designated by like reference numerals. A flash memory has a plurality of sense amplifiers. Thus, as shown in FIG. 14, if a plurality of resistors are provided for each sense amplifier, area penalty becomes very large. Therefore, according to the seventh embodiment, a reference current generating circuit 22 is provided at one portion in a flash memory, and a reference current is supplied to each sense amplifier from this reference current generating circuit 22.

As shown in FIG. 15, the reference current generating circuit 22 is composed of: a plurality of resistors R1, R2, and R3; NMOSN25, N26, and N27 for selecting these resistors R1, R2, and R3; a current mirror circuit composed of PMOSP31 and P32; and NMOSN31. A current corresponding to a reference current that flows to each reference memory cell generated by means of the reference current generating circuit 22 is outputted from a connection node of NMOSN31 and PMOSP30. This current is supplied to a gate of NMOSN32. This NMOSN32 is connected to the sense amplifier SA10 via NMOSN33.

In the above configuration, in response to a test command, a signal $\phi$ is set at a low level, and a signal/$\phi$ is set at a high level when a threshold voltage adjusting mode of a reference memory cell is established. Thus, the reference memory cell RMC is connected to one input end of the sense amplifier SA10 via NMOSN23 and N10, and NMOSN32 is connected to the other input end of the sense amplifier SA10 via NMOSN33 and N11.

In addition, any one of NMOSN25, N26, and N27 is turned ON in response to a threshold voltage set to the reference memory cell RMC, and any one of the resistors R1, R2, and R3 is selected. In this state, writing into the reference memory cell RMC is carried out, and the sense amplifier SA10 detects a current that flows to the reference memory cell RMC and a current that flows to a selected resistor. This operation is repeated until the current that flows to the reference memory cell RMC has been equal to the current that flows to the selected resistor.

According to the seventh embodiment described above, one reference current generating circuit 22 is provided in a flash memory, and the current generated by means of this reference current generating circuit 22 is supplied to each sense amplifier. Thus, area penalty can be remarkably restricted as compared with a case of connecting a plurality of resistors for each sense amplifier.

In the above-described reference current generating circuit 22 using a current mirror system, a current margin may change due to a temperature or voltage dispersion. However, adjustment of the reference memory cell RMC is executed in a test process, thus making it possible to manage such a temperature or voltage dispersion and making it possible to allocate such a current margin.

Eighth Embodiment

In the seventh embodiment described above, even if a resistor set with sufficiently high precision has been used, dispersion with the resistance values occurs. Thus, a desired current value is not always generated by a resistor.

Figure 16:
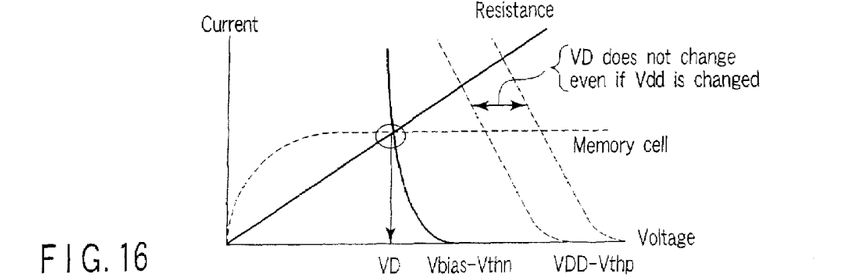
FIG. 16 is a view showing a relationship between a voltage and a reference current supplied to the sense amplifier shown in FIG. 15.

FIG. 16 shows a relationship between a voltage supplied to a sense amplifier SA10 shown in FIG. 15 and a reference current.

In a circuit shown in FIG. 14, NMOSN10 supplied with a bias voltage Vbias is connected to a gate between a node supplied with a power supply voltage Vdd and each of resistor R1, R2, and R3. Thus, even if the power supply voltage Vdd is controlled, a voltage VD applied to each of the resistors R1, R2, and R3 is determined depending on NMOSN obtained when the bias voltage Vbias has been supplied to the gate. Therefore, even in the case where the resistance values of the resistors R1, R2, and R3 are shifted from each other, it is difficult to adjust a reference current from the outside.

Figure 17:
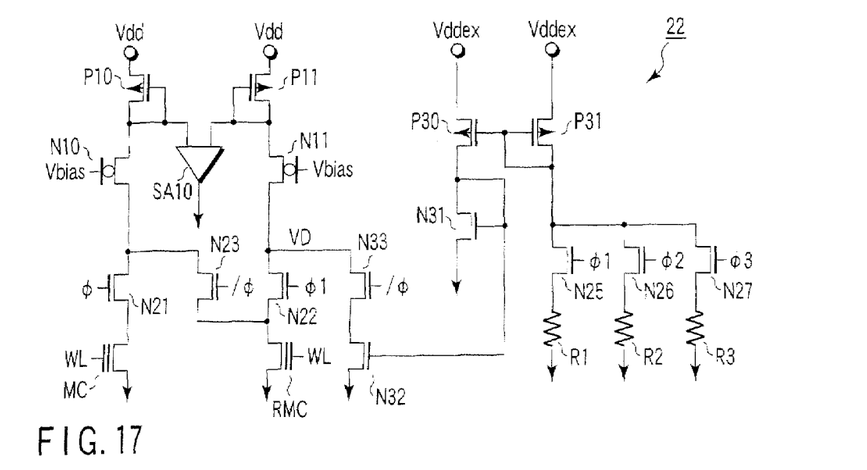
FIG. 17 is a circuit diagram depicting a sense amplifier in accordance with an Iref direct coupling system including an adjusting circuit of a reference memory cell according to an eighth embodiment.

Therefore, according to an eighth embodiment, as shown in FIG. 17, a power supply voltage of a reference current generating circuit 22 is defined as Vddex separated from a power supply voltage Vdd used in peripheral circuits including the sense amplifier SA10.

In the above-described embodiment, after measuring a current that flows to the reference current generating circuit 22, assuming that a reference current value is shifted due to dispersion in resistance values of the resistors R1, R2, ad R3, the power supply voltage Vddex is controlled from the outside. With such a configuration, even in the case where dispersion in resistance values of the resistors R1, R2, and R3 occurs, the reference current value can be set at a desired current value.

Figure 18:
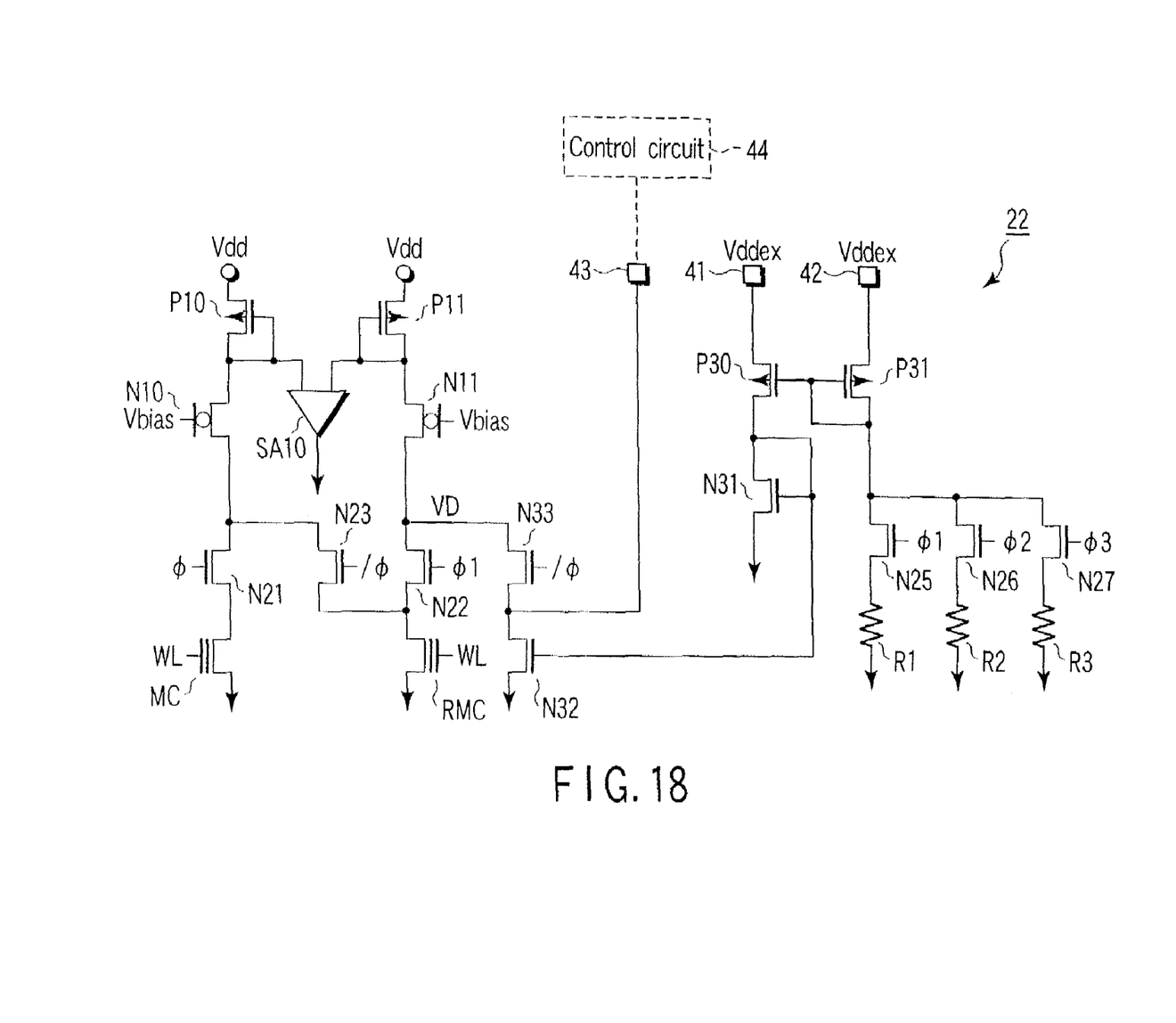
FIG. 18 is a circuit diagram depicting a modified example of the eighth embodiment.

FIG. 18 shows a modified example of the eighth embodiment. Like constituent elements shown in FIG. 17 are designated by like reference numerals.

This modified example shows a case of supplying the above-described power supply voltage Vddex from test pads 41 and 42 for supplying a test signal. In addition, a connection node of NMOSN32 and N33 is connected to a test pad 43.

In this configuration, at the time of adjustment of a reference memory cell RMC, a control circuit 44 is connected to the test pad 43. The control circuit 44 monitors from the outside what degree of current flows to a resistor selected in response to the power supply voltage Vddex. Further, the control circuit 44 controls the power supply voltage Vddex in response to the monitored current value. Therefore, even in the case where dispersion with the resistance values occurs, the threshold voltage of the reference memory cell RMC can be controlled with high precision by adjusting the power supply voltage Vddex.

In addition, the number of pads can be reduced by supplying the power supply voltage Vddex from the test pads 41 and 42.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device, comprising:
a sense amplifier in which a current flowing through a selected memory cell is supplied to one input end, and a current flowing through a reference memory cell is supplied to the other input end;
a first transistor connected between the other input end of the sense amplifier and the reference memory cell;
a second transistor, one end of which is connected to the other input end of the sense amplifier;
a constant current source connected to the other end of the second transistor; and
a third transistor, one end of which is connected to one input end of the sense amplifier, and the other end of which is connected between the first transistor and the reference memory cell;
wherein the first transistor is turned OFF, and the second and third transistors are turned ON at the time of adjustment of the reference memory cell.

2. The device according to claim 1, wherein the constant current source comprises:
a plurality of resistors each having a resistance value different from another one; and
a selector circuit which selects a plurality of the resistors.

3. The device according to claim 1, wherein the constant current source further comprises:
a fourth transistor, one end of which is connected to the other end of the second transistor; and
a current mirror circuit in which one end of a current path is connected to the selector circuit, and the other end of the current path is connected to a gate electrode of the fourth transistor.

4. The device according to claim 3, wherein the current mirror circuit and the sense amplifier are connected to a same power source.

5. The device according to claim 3, further comprising first and second test pads connected to first and second current paths of the current mirror circuit, wherein power different from power of the sense amplifier is supplied to the first and second test pads.

6. The device according to claim 5, further comprising a third test pad connected between the second transistor and the fourth transistor.

7. The device according to claim 6, further comprising a control circuit connected to the third test pad, wherein the control circuit detects a current value which flows to the third test pad, and controls a voltage of power supplied to the first and second test pads in response to the detected current value.

8. The device according to claim 1, wherein the memory cells configure a NOR type flash memory.

* * * * *